(12) United States Patent
Blangetti et al.

(10) Patent No.: US 6,623,241 B2
(45) Date of Patent: Sep. 23, 2003

(54) LOW-PRESSURE STEAM TURBINE

(75) Inventors: Francisco Leonardo Blangetti, Baden (CH); Harald Reiss, Heidelberg (DE)

(73) Assignee: Alstom (Switzerland) Ltd, Baden (CH)

( * ) Notice: Subject to any disclaimer, the term of this patent is extended or adjusted under 35 U.S.C. 154(b) by 2 days.

(21) Appl. No.: 09/987,129

(22) Filed: Nov. 13, 2001

(65) Prior Publication Data

US 2002/0098083 A1 Jul. 25, 2002

(30) Foreign Application Priority Data

Nov. 14, 2000 (DE) .......................... 100 56 241

(51) Int. Cl.[7] ................................ F01D 5/28
(52) U.S. Cl. .................. 415/200; 416/241 R
(58) Field of Search ................. 415/191, 200; 416/223 A, 223 R, 241 R

(56) References Cited

U.S. PATENT DOCUMENTS

| | | | | |
|---|---|---|---|---|
| 3,083,448 A | * | 4/1963 | Moore et al. | 416/241 R X |
| 3,561,886 A | * | 2/1971 | Kreischer, Jr. et al. | 416/241 R X |
| 4,832,993 A | * | 5/1989 | Coulon | 416/241 R X |
| 6,110,329 A | * | 8/2000 | Holleck et al. | 204/192.15 |
| 2002/0132131 A1 | * | 9/2002 | Bossmann et al. | 416/241 R X |

FOREIGN PATENT DOCUMENTS

| | | | | |
|---|---|---|---|---|
| DE | 37 24 626 A1 | | 2/1988 | |
| DE | 196 07 979 A1 | | 9/1997 | |
| DE | 196 25 329 A1 | | 1/1998 | |
| EP | 507131 A1 | * | 10/1992 | ............. F01D/5/28 |
| JP | 55134702 A | * | 10/1980 | ............. F01D/5/28 |
| JP | A-57-91398 | | 6/1982 | |
| JP | 63295803 A | * | 12/1988 | ............. F01D/5/28 |
| JP | 01219301 A | * | 9/1989 | ............. F01D/5/28 |
| JP | A-09-053612 | | 2/1997 | |
| WO | WO 9749840 A1 | * | 12/1997 | ........... C23C/14/02 |
| WO | WO 00/75394 A1 | | 12/2000 | |

* cited by examiner

*Primary Examiner*—Edward K. Look
*Assistant Examiner*—Richard A. Edgar
(74) *Attorney, Agent, or Firm*—Burns, Doane, Swecker & Mathis, L.L.P.

(57) ABSTRACT

A low-pressure turbine is provided with stationary and rotating blades, and the blades have a coating that is hydrophobic or water-repellant and has a smooth surface. The coating preferably contains amorphous carbon. The hydrophobic property of the coating has the result that small droplets contained in the steam phase, upon impacting a coated blade, roll off across the blade in the form of small droplets and further follow the steam path. This prevents moisture losses and increases the efficiency of the turbine. It also prevents the small droplets on the blades from coalescing into larger droplets or into a fluid film. This prevents droplet impingement erosion caused by the impact of large droplets on the blading and other components of the turbine.

14 Claims, No Drawings

LOW-PRESSURE STEAM TURBINE

FIELD OF THE INVENTION

The invention relates to the stationary and rotating blades of a low-pressure steam turbine, and in particular to a coating for such blades used to increase the efficiency of the low-pressure steam turbine.

BACKGROUND OF THE INVENTION

The expansion of the turbine steam in a low-pressure turbine to condenser pressure usually results in a range for wet steam. The mass content of the condensation water in the wet waste steam can be up to 14%. The impulse of the entire mass flow-rate of the turbine steam is preserved, independently from the condensation water content. However, the presence of a liquid phase in the rotating and stationary elements of the turbines results in increased dissipative losses. In a low-pressure turbine, about 12–14% of the mass flow-rate is generated in the form of water. This moisture loss results in a loss of efficiency of the low-pressure turbine of approximately 6–7%, which corresponds to a loss of efficiency of approximately 1–2% of an entire steam power plant. In combination and nuclear power plants, the contribution of power of the low-pressure turbine in relation to the overall plant power is slightly higher by comparison, so that the loss in overall efficiency due to moisture losses is approximately 2–2.3% or 3–3.5% overall.

The extent of losses depends for the most part on the size of the water droplets. In most cases, only small droplets, in the range of micrometers, are contained in the steam phase. The water droplets maintain their size and do not coalesce into larger droplets as long as they keep floating or flowing in the steam. Similar to a vapor, they flow along with the steam path that exerts the impulse onto the turbine blades. As long as the droplets remain in this small size range, they do not have an adverse effect on either the operation or on the performance of the turbine. However, as they flow through the stationary and rotating blades, the droplets grow. During the contact with metal surfaces, probably in particular with the concave metal surfaces of the stationary blades, the small condensate droplets spread on the surface and form a closed condensate film that flows on the blades over the concave or convex surfaces subject to the effect of the shearing forces of the steam. At the trailing edge of the blade, the fluid film leaves the surface and is accelerated and divided by the rotating blades. The droplets generated by this division have a larger diameter than the droplets created by spontaneous condensation.

By centrifugal forces, these larger droplets are spun outward by the rotating blades in the direction towards the turbine housing. This means that a part of the impulse of the working medium is not transferred onto the blades, which results in a moisture loss that reduces the degree of efficiency of the low-pressure turbine. This phenomenon is even stronger the more that the size and mass of the droplets, and therefore of the centrifugal force, increase. Furthermore, accumulations of water at the inside surfaces of the housing of the low-pressure turbine result in dissipative friction losses on the rotating blade tips and blade shrouds. Finally, enlarged droplets with diameters in the range from 100–200 $\mu$m and speeds in the range of more than 250 m/s cause droplet impingement erosion due to the impact of the droplets. This droplet impingement erosion depends greatly on the specific materials being used in the turbine blades. It has been found that blade materials of titanium and titanium alloys, which are used preferably for the large blades of the low-pressure turbine, are especially susceptible.

For a long time, attempts have been made to provide the blades of turbines with a coating that would increase the droplet impingement erosion resistance of the blades, thus extending their useful life. DE 37 24 626 describes a coating for the blades of a steam turbine that consists of a hard, wear-resistant ceramic material or of a multi-layer coating of active metal and a shroud layer of a ceramic material. The coating made from ceramic material is used to increase the droplet impingement erosion resistance of the blades, while the layer of active material improves the adhesion of the coating.

SUMMARY OF THE INVENTION

In view of the above-described losses and damage encountered with low-pressure turbines, which are caused by condensate droplets in the steam path, the invention is directed to blading for a low-pressure turbine, the metallic surfaces of the blades being produced in a manner that prevents the formation of a closed fluid film. The turbine blades according to an embodiment of the invention have reduced moisture losses, and the efficiency of the turbine is increased. At the same time, resistance against droplet impingement erosion resulting from the impact of droplets against the blading and/or turbine housing is ensured.

In accordance with an embodiment of the invention, at least the stationary blades in a low-pressure turbine are provided with a coating that is hydrophobic or water-repellant, and has a smooth surface.

The hydrophobic property of the blade coating has the result that the smaller droplets contained in the steam phase maintain their identity when they impact a coated blade. The hydrophobic blade coating also prevents droplets from coalescing into larger droplets, and prevents a closed fluid film from forming. Instead, all droplets roll across the coated surface. Once they roll off the blade, they remain as floating droplets following the steam path, and in this way exert an impulse on other blades. In low-pressure turbines in which blades are provided with the coating according to the invention, moisture losses are substantially prevented. This also means that the efficiency of the low-pressure turbine is increased.

The invention also has the advantage that the hydrophobic coating indirectly prevents droplet impingement erosion caused by the impact of large droplets on the blading or other turbine components. As a result of the hydrophobic property of the coating, no large droplets form on the blading, and no closed fluid film that would be divided into large droplets at the blade edge is formed. This means that no large droplets that would cause droplet impingement erosion due to the impact of droplets are created. A smooth coating furthermore supports the quick rolling-off of the small droplets and helps prevent the coalescing into larger droplets.

In a first embodiment of the invention, the hydrophobic coating contains amorphous carbon. The term amorphous carbon as used herein includes a preferred embodiment with hydrocarbon-containing carbon layers with up to 10 to 50 atom % hydrogen content and a ratio of $sp^3$ to $sp^2$ bonds between 0.1 and 0.9. In general, all amorphous or dense carbon layers as well as plasma polymer layers, polymer-like, or dense carbon and hydrocarbon layers produced with carbon or hydrocarbon precursors can be used, as long as they have the hydrophobic mechanical or chemical properties mentioned below of the amorphous carbon for the production of individual layers or sequences of layers.

Amorphous carbon, also called diamond-like carbon, is generally known for its extraordinary hardness, chemical stability, as well as elasticity. Under certain conditions, amorphous carbon furthermore has a low surface energy in comparison to the surface tension of water, so that a hydrophobic or water-repelling property is achieved. The hardness of amorphous carbon can be changed by varying the parameters for producing a coating. In comparison to a harder amorphous carbon layer, a softer amorphous carbon layer (within the hardness range of amorphous carbon) has a distinct hydrophobic property.

For this reason, the coating in a preferred embodiment of the invention has a hydrophobic single layer with amorphous carbon or a plasma polymer with a thickness between 1 and 8 micrometers and a hardness between 500 and 1500 Vickers. It is preferred that the thickness is between 2 and 4 micrometers.

In addition, amorphous carbon or a plasma polymer adheres very well to typical blade materials, so that it is not necessary to ensure sufficient adhesion by roughening the blade material. Amorphous carbon or a plasma polymer is therefore particularly suitable for long-term applications, for example on blading in a turbine.

In another embodiment of the coating, the hydrophobic single layer is constructed with amorphous carbon or a plasma polymer as a gradient layer. The gradient layer has a hardness that gradually changes through its depth, whereby its lowest depth ranges are the hardest, and its top depth ranges are the softest. The top depth ranges of the gradient layer have a hardness between 500 and 1500 Vickers and a thickness between 0.1 and 2 micrometers. The lower depth ranges of the hydrophobic gradient layer have a hardness between 1500 and 3000 Vickers and a thickness between 0.1 and 6 micrometers, preferably between 1 and 3 micrometers.

In another embodiment, the hydrophobic coating again contains amorphous carbon or a plasma polymer. However, the coating in particular has a discrete.sequence of layers with at least one harder layer with amorphous carbon and at least one softer layer with amorphous carbon or a plasma polymer, whereby the harder and softer layers are applied alternately to the surface of the blades. As an example, the first layer can be provided as a harder layer, and the last layer can be provided as a softer layer, whereby the softer layer is similar to the coating in the first embodiment and has a hydrophobic property.

The coating according to the invention has the additional advantage that it offers protection from droplet impingement erosion due to the impact of droplets. As already mentioned, because larger droplets are prevented from forming, fewer droplets of a size that could cause droplet impingement erosion by impact on blading, shrouds, and housing components, etc., are present. Furthermore, the second embodiment's sequence of layers of harder and softer layers ensures additional protection from droplet impingement erosion caused by droplet impact since it absorbs the impulse of an impacting droplet. The impulse of impacting droplets is absorbed by the softer and harder layers because the compression waves originating from the impact of the droplets are extinguished by interference by the pairs of harder and softer layers. The extinguishment of the compression waves is similar to the extinguishment of optical waves caused by pairs of thin layers with respectively high and low indices of refraction.

The extinguishment of compression waves is further increased by a layer sequence of several pairs of harder and softer layers. In another embodiment of the invention, the coating according to the invention has several pairs of layers with each pair having one harder and one softer layer of amorphous carbon.

In another embodiment of the invention, both the stationary and the rotating blades are provided with the coating according to the invention. Here the formation of a film of condensate on the surfaces of both the stationary blades as well as the rotating blades is prevented. This further ensures an increase of the efficiency of the low-pressure turbine by preserving the condensate in the form of small droplets in the steam path. The rotating blades are additionally protected from droplet impingement erosion caused by the impact of droplets.

The coating according to the invention can be realized in accordance with various generally known production processes, for example by precipitation using corona discharge in a plasma of hydrocarbon-containing precursors, ion beam coating, and sputtering of carbon in a hydrogen-containing working gas.

In these processes, the substrate is exposed to a flow-rate of ions with several 100 eV. During corona discharge, the substrate is arranged in a reactor chamber in contact with a cathode connected capacitively with a 13.56 MHz radio frequency generator. The grounded walls of the plasma chamber form a large counter-electrode. In this arrangement, any hydrocarbon vapor or hydrocarbon gas can be used as a first working gas for the coating. In order to achieve special layer properties, for example different surface energies, hardness values, optical properties, etc., different gases are added to the first working gas. By adding nitrogen, fluorine- or silicon-containing gases, high or low surface energies are achieved, for example. Added nitrogen always increases the hardness of the resulting layer. Changing the bias voltage above the electrodes between 100 and 1000 V furthermore makes it possible to control the resulting hardness of the layer, whereby a high bias voltage produces a harder amorphous carbon layer, and a low voltage produces a softer amorphous carbon layer. In order to achieve a gradient layer, the production parameters, such as, for example, the composition of the plasma in the reactor chamber, are gradually changed.

In one exemplary embodiment of the invention, the hardness of a harder layer in a pair of amorphous carbon layers is between 1500 and 3000 Vickers, while the hardness of a softer layer in a pair of amorphous carbon layers is between 800 and 1500 Vickers.

The thicknesses of the individual layers can be between 0.1 and 2 $\mu$m, preferably between 0.2 and 0.8 $\mu$m, if several layers are applied consecutively in the sequence of layers.

Furthermore, the thickness values of the harder layers and softer layers are preferably inversely proportional to their hardness values.

The adhesion of the coating according to the invention is well ensured for most types of substrates. It is especially good for materials that form carbides, such as titanium, iron, and silicon, as well as aluminum, but not for precious metals, copper, or copper-nickel alloys. The substrate surface, i.e. the surface of the blading, does not require roughening. To further improve adhesion, an adhesion layer, on which the sequence of layers according to the invention is then applied, could be realized on the surface of the blading. A suitable adhesion layer is, for example, titanium.

The coating according to the invention therefore can be applied to different substrate materials used for blades, such as, for example, titanium, stainless steel types, chrome steel types, aluminum, as well as all materials forming carbides.

The coating according to the invention is particularly suitable for increasing the efficiency of existing low-pressure turbines (retrofit), since the blades can be removed, coated, and then without any further work, reinstalled.

What is claimed is:

1. A low-pressure turbine having blades comprising stationary and rotating blades, wherein:
   at least the stationary blades are provided with a coating that is hydrophobic and has a smooth surface.

2. The low-pressure turbine according to claim 1, wherein:
   the hydrophobic coating includes amorphous carbon or a plasma polymer.

3. The low-pressure turbine according to claim 2, wherein:
   the hydrophobic coating is a single layer with a thickness between 1 and 8 micrometers.

4. The low-pressure turbine according to claim 3, wherein:
   the hydrophobic coating has a hardness between 500 and 1500 Vickers.

5. The low-pressure turbine according to claim 2, wherein:
   the hydrophobic coating is a single layer having a gradient of hardness over the depth of the single layer.

6. The low-pressure turbine according to claim 5, wherein:
   a depth range near the top of the gradient layer is softer than a remaining depth of the gradient layer, and the depth range near the top of the gradient layer has a hardness between 500 and 1500 Vickers.

7. The low-pressure turbine according to claim 6, wherein:
   the depth range near the top of the gradient layer has a thickness between 0.1 and 2 micrometers.

8. The low-pressure turbine according to claim 6, wherein:
   the remaining depth of the gradient layer has a hardness between 1500 and 3000 Vickers and a thickness between 0.1 and 6 micrometers.

9. The low-pressure turbine according to claim 2, wherein:
   the hydrophobic coating includes a sequence of discrete layers including at least one relatively harder layer with amorphous carbon and at least one relatively softer layer with amorphous carbon or a plasma polymer;
   at least one relatively harder layer and at least one relatively softer layer are applied alternately to the surfaces of the blades, and the lowest layer of the sequence of layers is a relatively harder layer with amorphous carbon or a plasma polymer, and the uppermost layer of the sequence of layers is a relatively softer layer with amorphous carbon or a plasma polymer, and at least the uppermost, relatively softer layer has a hydrophobic property.

10. The low-pressure turbine according to claim 9, wherein:
    the at least one relatively harder layer with amorphous carbon or a plasma polymer each has a hardness between 1500 and 3000 Vickers, and the at least one relatively softer layer with amorphous carbon or a plasma polymer has a hardness between 500 and 1500 Vickers.

11. The low-pressure turbine according to claim 9, wherein:
    the at least one relatively harder and at least one relatively softer layers of the sequence of discrete layers each have a thickness between 0.1 and 2 micrometers.

12. The low-pressure turbine according to claim 9, wherein:
    the thicknesses of the relatively harder and relatively softer layers are inversely proportional to their hardness.

13. The low-pressure turbine according to claim 1, wherein:
    an adhesion layer is applied between the surface of the blades and the coating.

14. The low-pressure turbine according to claim 1, wherein:
    the coating is applied to the surfaces of the stationary and the rotating blades of the low-pressure turbine.

* * * * *